United States Patent [19]

Negm et al.

[11] Patent Number: 5,399,547

[45] Date of Patent: Mar. 21, 1995

[54] METHOD FOR INCREASING THE CRITICAL CURRENT DENSITY OF HIGH TRANSITION TEMPERATURE SUPERCONDUCTORS

[75] Inventors: Yehia Z. Negm, Braintree; George O. Zimmerman, South Hamilton; Robert E. Powers, Jr., East Boston, all of Mass.

[73] Assignee: Trustees of Boston University, Boston, Mass.

[21] Appl. No.: 122,623

[22] Filed: Sep. 17, 1993

Related U.S. Application Data

[63] Continuation-in-part of Ser. No. 902,224, Jun. 19, 1992, Pat. No. 5,296,459.

[51] Int. Cl.⁶ .......................... B05D 3/02; B05D 5/12
[52] U.S. Cl. ................................. 505/430; 505/434; 505/704; 505/706; 427/62; 427/125; 427/191
[58] Field of Search ................... 505/1, 706, 701, 704, 505/430, 434; 427/62, 63, 125, 191

[56] References Cited

U.S. PATENT DOCUMENTS 5,071,826 12/1991 Anderson et al. .................... 505/1

FOREIGN PATENT DOCUMENTS 5-151844 6/1993 Japan .

OTHER PUBLICATIONS

Katz et al, "Low-Resistivity YBa$_2$Cu$_3$O$_7$–to–Silver Electrical Contacts by Plasma Spraying", J. Appl. Phys. 65(4)Feb. 1989, pp. 1792–1794.

*Primary Examiner*—Roy V. King
*Attorney, Agent, or Firm*—David Prashker

[57] ABSTRACT

The present invention provides a methodology for increasing the critical current density carried by high transition temperature; superconductive materials. The methodology is employed using any Noble metal to form an electrically conductive coating; and is used with any high transition temperature superconductive material conventionally known. The resulting improved superconducting material demonstrates an enhanced critical current density capability in the order of 48%; and substantially decreases the degradation of the critical current density in the presence of an applied magnetic field; and offers a range of other advantages including environmental degradation protection, an increased mechanical strength, and an improved capability for adding electrical contacts.

2 Claims, 2 Drawing Sheets

METHOD FOR INCREASING THE CRITICAL CURRENT DENSITY OF HIGH TRANSITION TEMPERATURE SUPERCONDUCTORS

CROSS-REFERENCE

This application is a Continuation-In-Part of prior U.S. patent application Ser. No. 902,224, filed Jun. 19, 1992, now U.S. Pat. No. 5,276,459.

FIELD OF THE INVENTION

The present invention is concerned with the critical currents able to be carried by high temperature superconductive ceramics at temperatures between about 75–80K and 4.5K; and is particularly directed to methods for increasing the critical current density load and avoiding deterioration of the critical current density in the presence of a magnetic field.

BACKGROUND OF THE INVENTION

Superconductivity was first observed by the Dutch physicist H. K. Onnes in 1911 during his investigations of the electrical conductivities of metals at very low temperatures. Onnes observed that as purified mercury is cooled, its electrical resistivity vanishes abruptly at a temperature of 4.16K. Above this temperature, the electrical resistivity is small but finite and measurable; alternatively, when the temperature is reduced below 4.16K, the electrical resistivity is so small that it is effectively zero. This distinct temperature at which the transition and loss of effective electrical resistivity occurs has been termed the critical temperature or "$T_c$". Onnes believed he had discovered a new physical state of matter at temperatures below the critical temperature and coined the term "superconducting state" for the observed phenomenon at temperatures below the critical temperature ($T_c$) and the term "normal state" for the electrical properties observed at temperatures above the critical temperature. Onnes also found that the superconducting transition is reversible and that the superconducting material recovered its normal, electrical resistivity at the critical temperature.

The modern theory of superconductivity is the result of the research investigations by Bardeen, Cooper, and Schrieffer [Phys. Rev 106:162 (1957)]. Their proposal, conventionally known as the "BCS theory", has now gained universal acceptance because it has proved capable of explaining most of the observed phenomena relating to superconductivity. Their principles employ a quantum mechanical treatment of the superconductive phenomenon; and their theory has been employed to explain the various observable effects such as zero electrical resistance, the Meissner effect, and the like. Since the BCS theory is so steeped in quantum mechanics, the reader is directed to published texts in the scientific literature for a complete description and explanation. These include: M. A. Omar, *Elementary Solid State Physics: Principles and Applications*, Addison-Wesley Publishing Company, 1975, pages 496–527; M. Tinkham, *Introduction to Superconductivity*, McGraw-Hill Co., 1975.

Superconductivity has been found not to be a rare phenomenon. It is exhibited by a substantial number of atomic elements, metallic alloys, and most recently, refractory oxide ceramics. For many years, the highest known critical temperature was only 23K. There has, accordingly, been intense interest and research investigations into finding superconductive materials with much higher critical temperatures, most desirably those which hopefully would approach room temperature (20° C.). Until relatively recently, efforts to achieve this goal have met with complete failure. Beginning about 1986, however, polycrystalline scintered ceramic pellets of yttrium-barium-copper oxide and mixtures of thalium, strontium barium, bismuth, and copper oxygen have been found to demonstrate relatively high critical temperatures ($T_c$) and superconductivity at temperatures up to 120K [Bednorz, J. G. and K. A. Muller, *Z. Phys. B*64:189 (1986); Wu et al., *Phys. Rev. Lett.* 58:905 (1987); and Chu et al., *Phys. Rev. Lett.* 60:941 (1988)]. These compounds are now conventionally termed high transition temperature or "high $T_c$" superconductors.

Since about 1986, interest in superconductive materials as potential replacements for conventionally known metal in wiring and microcircuitry has risen appreciably; and the search for ever-higher $T_c$ superconductors in various formats is presently an area of intense exploration. Mersly representative of these continuing research investigations and recently reported developments are the following publications: *Experimental Techniques in Condensed Matter Physics at Low Temperatures*, (R. C. Richardson and E. N. Smith, editors), Addison Wesley Inc., 1988, pages 118–123; TG. K. White, *Experimental Techniques in Low-Temperature Physics*, Oxford University Press, 1959, pages 295–298; *Advances in Superconductivity*, Proceedings of the 1st International Symposium on Superconductivity, August 1988, Nagoya, Japan; Yeh et al., *Phys. Rev. B*36:2414 (1987); Morelli et al., *Phys. Rev. B*36:3917 (1987); Chaudhari et al., *Phys. Rev. B*36:8903(1987); Tachikawa et al., *Proc. IEEE* 77:1124 (1989); Tabuchi et al., *Appl. Phys. Lett.* 53:606 (1989); Sacchi et al., *Appl. Phys. Lett.* 5:3:1111 (1988); Abell et al., *Physica C*162–164:1265 (1989); Bailey et al., *Physica C*167:133 (1990); Xiao et al., *Phys. Rev. B*36:2382 (1987); Matsuda et al., *Mat. Res. Soc. Symp. proc.* 99:695 (1988); Witanachchi et al., *J. Mater. Res.* 5:717 (1990); *Superconductive Industry*, Winter, 1989, page 31; *Engineer's Guide to High-Temperature Superconductivity*, Wiley & Sons, Inc. 1989; and D. Newman, *Superconductive Industry* 3:16 (1990).

One recurring kind of problem for superconductors generally has been the electrical joining and union of superconductive materials, particularly the juncture of high $T_c$ superconductors or "FITSC", to each other and to other electrically conductive materials in the normal state at temperatures between 70K and 300K and to conventional superconductive materials which have a transition temperature below 30K. By definition, electrically conductive materials in the normal state include both the normal conductors such as gold, silver, cooper, and iron; and the semi-conductors such as carbon, silicon, gray tin, and germanium; as well as their respective mixtures with indium, gallium, antimony, and arsenic. It is also difficult to make effective low resistance juncture and electrical union with the atomic elements and alloys most frequently used in practical superconducting applications. These typically are the conventionally known superconductors Nb, NbTi, and NbSn; and these frequently serve as materials to make superconducting motors, generators, and magnets which operate at liquid helium temperature (4.5K).

Traditionally, solders—a general term for alloys useful for joining metals together by the process of soldering—have been used directly as an intermediate to join superconductors to themselves, to semi-conductors, and to normal conductors. The principal types of solder conventionally known are: soft solders such as lead-tin alloys; and brazing solders such as alloys of copper and zinc and sometimes silver. Representative of conventionally known solders and soldering techniques are U.S. Pat. No. 3,600,144 describing a low melting point brazing alloy; U.S. Pat. No. 4,050,956 describing a method of chemically bonding metals to refractory oxide ceramics; U.S. Pat. No. 4,580,714 disclosing a hard solder alloy comprising copper, titanium, aluminum, and vanadium; U.S. Pat. No. 4,582,240 revealing a method for intermetallic diffusion bonding of piezoelectric components; U.S. Pat. No. 4,621,761 identifying a brazing process for forming strong joints between metals and ceramics while limiting the brazing temperature to not more than 750° C.; and U.S. Pat. No. 4,631,099 describing a method for adhesion of oxide type ceramics and copper or a copper alloy. Unfortunately, solders alone and the conventionally known soldering techniques have proven inadequate for junctures of high $T_c$ superconductors.

For this reason, many investigators have attempted to generate specialized techniques for lowering the resistance of electrical contacts between two high $T_c$ superconductive materials or between high $T_c$ superconductors and a metal. Representative examples of these techniques include: vapor deposition of silver followed by annealing bulk sintered samples of yttrium-barium-copper oxide at temperatures up to 500° C. for an hour [*Superconductor News* May-June, 1988, page 5]; the use of laser energy to deposit a thin film of superconductive yttrium-barium-copper oxide directly onto a silicon substrate [*Superconductor News*, May-June, 1988, page 1]; electrolytic depositing of gold onto superconducting particles [U.S. Pat. No. 4,971,944]; sputter depositing a layer of silver on a yttrium-barium-copper oxide surface [Ekin et al., *Appl. Phys. Lett.* 52 (1988)]; U.S. Pat. No. 4,963,523]; deposition of silver or gold on a superconductive material [Van der Mass et al., *Nature* 328:603 (1987)]; thermal evaporation of silver on a yttrium-barium-copper oxide surface [Tzeng et al., *Appl. Phys. Lett.* 52 (1988)]; the use of silver paste on superconductive materials [Munakata. et al., *Jap J. Appl. Phys.* 26: (1987)]; the pressing of platinum against YBCO [Grader, G. S., *App. Phys. Lett.* 51: (1987)]; and spark bonding [Lye et al., *Jap. J. App. Phys.* 27: (1988)].

In addition, see also Ekin et al., *App. Phys. Lett.* 52:331 (1988); Elkin et al., *App. Phys. Lett.* 52:1819 (1988); Suzuki et al., *Appl Phys. Lett.* 54:666 (1989); Jin et al., *Appl. Phys. Lett.* 54:2605 (1989); and Katz et al., *J. Appl. Phys.* 65:1792 (1989). These publications describe the formation and use of different types of contact pads as current and voltage leads including indium contacts; ultrasonically soldered bonds; silver paste which is first baked and then soldered into the superconductor; sputtering; metal spraying; and silver vapor deposition.

Recently, a major improvement in preparing electrical contacts of minimal resistance for superconductors has occurred using a metallic particle diffusion method. This particle diffusion procedure uses noble metals such as silver in fragmented or powder form which are applied externally to the superconductor as a series of individual surface coatings; each coating is then sintered individually to its softening point; and then each is cooled such that it becomes embedded internally within the grains of the superconductive material. A final external coating provides a solidified contact of markedly reduced electrical resistance.

Another kind of continuing and concomitant problem of superconductors is the limited critical current density able to be conveyed by superconductors generally and the major deterioration of the limited critical current capacity upon the application or in the presence of a magnetic field. The critical current density ("$J_c$") of a superconductive material is defined as the maximal load of current density ("$J_c$") able to be conveyed or carried by a superconductor before it becomes a normal conductor. "$J_c$" is a function of temperature. For commercially available HTSC bulk materials generally, only very low loads of critical current density in the range of 400 amps per cm$^2$ to about 700 amps per cm$^2$ in a zero magnetic field are typical. Moreover, even these very limited load values of critical current capacity for superconductors become markedly reduced and greatly deteriorated when a magnetic field is applied to the superconductor.

Note that if in a perfect superconductor the energy of the shielding current exceeds the difference between the normal and superconducting free energy, the superconductor becomes normal. In HTSC materials, the critical current is limited by weak links between grains of superconductive material which are affected to a greater extent than single crystals by the magnetic field [M. Tinkman, *Introduction To Superconductivity*, McGraw-Hill, 1975].

Note also that the high $T_c$ materials belong to the category of type II superconductors, i.e., some flux is locked into the superconductor. When a superconducting current density, $J_c$, flows perpendicular to the direction of fluxoids (flux lines)($\Phi=h/2e$), the fluxoids are forced to move along the direction perpendicular to the current flow by the Lorentz force ($F=J\times\Phi$). This movements of fluxoids results in a finite resistivity caused by energy dissipation due to the pointing vector if the flux moves. The movement of the fluxoids can be due to an external magnetic field. Therefore, the pinning of fluxoids is necessary for the suppression of such resistivity. It is important that this array of fluxoids remains stable, since motion results in dissipation by normal currents induced in the fluxoid cores. Fluxoid stability and critical current density can be increased by the presence of impurities or defects, which tends to stabilize or "pin" the fluxoids; and there are several ways to create pinning centers including radiation defects, inclusion of a non-superconducting phase, and addition of silver. [Avvides etal., *Physica C* 179 (1991); Kes et al., *Cyrogenics* 29 (1989); Kubo et al., *Phys. Rev. B* 39 (1989); and Yamaguchi et al., *J. Appl. Phys.* 29 (1990)].

The application of high transition temperature superconductors (HTSC) for practical purposes, has thus been limited by their low critical currents and the deterioration of this critical current on the application of a magnetic field. Although some HTSC materials have been produced which have critical current densities in the order of 10$^5$ A/cm$^2$, these can only be made as films or in small laboratory quantities; and cannot be produced in moderate quantities because of the slow rate and the cumbersome and unreliable process by which they are produced [Izuni et al, *J. Mater Res.* 7: (1992); Jin et al., *Phys. Rev. B* 37: (1988); Monot et al., *J. Mater. Res.* 7: (1992); and Salama et al., *Appl. Phys. Lett.* 54:(1989)]. The forms of HTSC materials which can be produced in quantity are bulk sintered components which typically are produced from a powder. In general, the powder is mixed with an organic binder which is then carefully removed. The surface tension of the binder provides the necessary force to bring the powder grains together so that they can be sintered once the binder is eliminated.

The ultimate limitation on $J_c$ is thought to be the weak link behavior which develops between the powder grains during sintering [Gotch et al., *J. Appl. Phys.* 72:15 (1992)]. This behavior is enhanced, or may be a result of the extremely shod coherence length in these materials. In long lengths of the material, the critical current of the HTSC is also limited by micro-cracks, and the alignment of the grains since their conductivity is anisotropic. To a certain degree, those micro cracks can be filled by the addition of silver powder to the HTSC powder before the binder is added and before sintering [Neal et al., *IEEE Transactions, Applied Superconductivity* 1:(1991); and Itoh, M. and H. Ishigaki, *J. Mater. Res.* 6:2272 (1991)]. In addition, the silver may provide pinning centers for quantized magnetic flux lines and thus diminish flux motion, which contributes to resistivity in superconducting materials. The presence of silver leads to the increase of $J_c$ by increasing the resistance to thermal shock and subcritical crack growth via improvements in mechanical properties (such as strength and fracture toughness). Silver powder fills the weak links in the gaps between the grains and forms a conductive path for the current. Also, the $J_c$ is increased because the silver acts as a pinning center/pinning the magnetic; field as noted above. [Singh et al. *J. Mater. Res.* 8:(1993); Reich, S. and I. Felner, *J. Appl. Phys.* 67: (1990); and Peters et al., *Appl. Phys. Lett.* 52:(1988)]. The addition of silver, however, increases the thermal conductivity of the material—which in many applications is an undesirable effect since silver is a metal and has a higher thermal conductivity than HTSC.

Clearly, therefore, there; remains a well recognized need for effective means and methodology by which to meaningfully increase the critical current of superconductors which are electrically functional at temperatures between 100K–4.5K or lower and to avoid the deleterious effects of a magnetic field. If such effective means and methods were available, the electrical junction and union between the circuits and instruments of our everyday world could then be linked and employed in combination with the enhanced critical current capacity of circuits provided by superconductors generally. Such effective means and methodology, however, have as yet not been available in this art.

SUMMARY OF THE INVENTION

The present invention provides a method for markedly increasing the critical current density carried by a superconductive material, said method comprising the steps of:
  providing a noble metal in fragmented form;
  applying said noble metal fragments as at least one external coating over the exterior surface of a high transition temperature superconductive material;
  heating said external coating of noble metal fragments upon said superconductive material to a temperature greater than the softening-point temperature and less than the melting-point temperature of said noble metal whereby said heated noble metal fragments of said external coating penetrate and become embedded within said high transition temperature superconductive material; and
  allowing said embedded noble metal fragments within said superconductive material to cool and solidify.

BRIEF DESCRIPTION OF THE FIGURES

The present invention may be more easily and completely understood when taken in conjunction with the accompanying drawing, in which.

DETAILED DESCRIPTION OF THE PRESENT INVENTION

Figure 1:
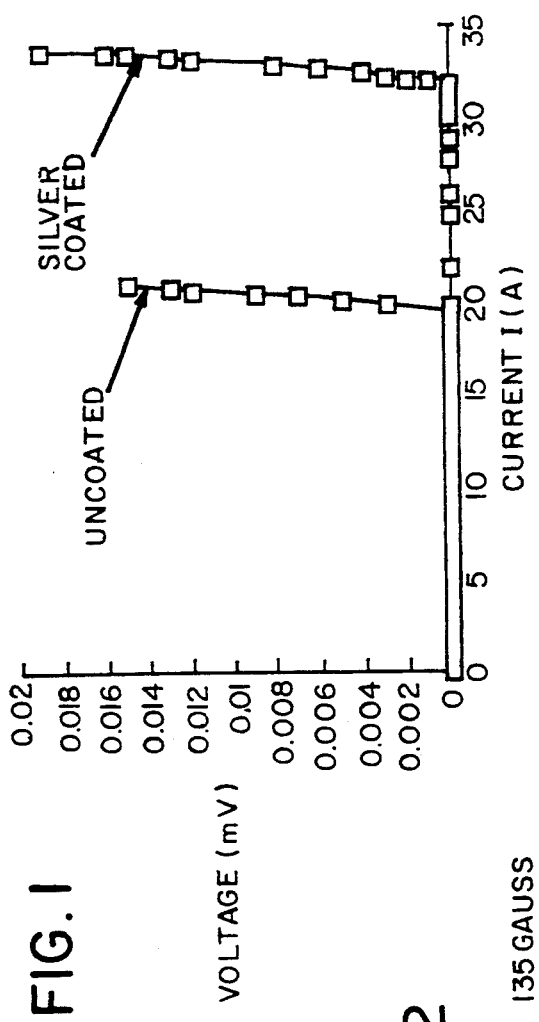
FIG. 1 is a graph illustrating the current voltage characteristics of silver coated and uncoated BSCCO rectangular rods.

The present invention is a method for increasing the critical current density able to be carried by and conveyed through a superconductive material; and is especially useful when the material is electrically joined to itself or another superconductor, to a semi-conductor, or to a normal conductor. The enhanced critical current carrying capacity serves as the means for markedly increasing the value and worth of the high transition temperature superconductive material as an electrical connector. The steps comprising the methodology and the resulting improvements in critical current densities are singular and unique in this art; and provide major advantages and unusual benefits to the user when designing and fabricating electrical circuits which employ high $T_c$ superconductors. Some of these advantages and benefits include the following:

1. Any high $T_c$ superconductive material may be employed with the methodology to form electrically conductive products with enhanced critical current density capacity. The methodology and the resulting enhanced superconductor may be employed with any configuration without limitation or restriction; and is especially advantageous with sheets, rods, wires or pellets whose smallest dimension is about 3 millimeters or less. HTSC materials are conventionally classified as "thin" when the thickness or diameter is in the range of about 1–20 microns; as "thick" when the dimensions are in the range of about 20 microns to 3 millimeters; and are considered as "bulk" when thicker than about 3 millimeters. The methodology is preferably employed and yields best results with thin and thick samples of HTSC which are 3 mm or less in thickness or diameter. The present methodology may also be gainfully used, but with diminishing results, with bulk HTSC materials greater than about 3 mm in thickness; however, beyond about 3 mm thickness, the greater the diameter or thickness of HTSC, the less the enhancement provided by the present invention. Accordingly, so long as the material is demonstrably a high $T_c$ superconductor by definition (and especially those whose smallest dimension is 3 mm or less) and presents a discernible exterior surface, the present methodology may be usefully employed to increase markedly the critical current density able to be conveyed by the superconductive material.

2. Unlike conventionally known methods and techniques for influencing the critical current density, the present methodology may be employed and practiced to embed an electrically conductive noble metal at and within the external surfaces of the superconductive material either before annealing (as with YBCO) or after annealing of the material with oxygen (as with BSSCO). Thus, regardless of the formulation or structure of the starting material, the enhancement processing may be performed prior to any annealing without subsequent loss of superconducting properties; or the enhancement processing may be practiced upon the previously annealed ceramic material and the ceramic material subsequently annealed in oxygen again to yield the superconduct or in conformity with conventional practice. It is most desirable or advantageous to the user, however, that only one annealing procedure be employed, a condition completely unlike and contrary to conventionally known requirements.

3. The present methodology has no need for and no requirement of the vacuum vapor deposition equipment or vacuum techniques whatsoever. Unlike prior art methods and techniques, there are no rigorous apparatus requirements and no vacuum conditions needed or desired in order to practice the present invention. Moreover, because no vacuum equipment is used, there is no meaningful limitation on the size or the dimensions or the configurations of the superconductor which is to be provided with increased critical current density capacity. Thus, not only is a rapid enhancement methodology provided by the present invention, there is a simplification of requirements resulting in a major reduction of capital investment, of equipment, and of human tedium as well.

4. The present methodology for increasing the critical current and the resulting enhanced superconductor, provides high temperature superconducting ceramics in which the value of the carried critical current is typically increased by 30% and often as much as 48% in comparison to the untreated superconductive material. Moreover, the recognized degradation of the carried critical current within an applied magnetic field has also been substantively decreased. These major improvements in critical current density capability and load carrying capacity-as well as the resistance to magnetic field degradation-are directly due to and the consequence of using the present methodology.

5. The resulting enhanced superconductive material provided by the present invention also yields a HTSC product which is protected from environmental degradation; is strengthened and mechanically improved in comparison to its untreated predecessor material; and provides for the placement and attachment of electrical contacts more easily and durably than was previously possible. These secondary improvements and advantages are highly desirable and advantageous in and of themselves.

6. The present methodology is very simple to implement and use; and may be performed by relatively unskilled persons in any laboratory or production/manufacturing setting. A minimum of materials are required; and only a minimum of care is needed to ensure that enhanced performance superconductor is formed which provides the desired increased critical current carrying properties.

I. The Superconductive Materials

As regards the high transition temperature superconductive materials which may be usefully employed using the present methodology to form an electrically conductive contact, a wide range of different refractory oxide compositions have recognized properties which identify them as HTSC compositions. A representative, but incomplete, listing is provided by Table 1 below.

TABLE 1

| Superconductive Composition | Name | $T_c$ (range, K) | Published Reference |
|---|---|---|---|
| Refractory oxide ceramics | yttrium barium copper oxides | up to 93 | |
| | $YBa_2Cu_3O_{7-x}$ BiSrCaCuO TlBaCaCuO La—Sr—CuO | up to 110 | # |

Wu et al., Phys. Rev. Lett. 58:905 (1987).
Chu et al., Phys. Rev. Lett. 60:941 (1988); and Dai et al., Intern. J. Mod. Phys. B3:77 (1989).

It will be recognized and appreciated that refractory ceramic oxides which constitute "high transition temperature" superconductors are desirable as the starting materials when using the present invention. The utilization and deployment of high transition temperature superconductors in current applications will depend in major degree upon the electrical properties of the individual superconductive material.

II. The Substances Employed For Increasing Critical Current Density Using the Present Methodology The substances employed within the present methodology for markedly increasing the critical current density are those atomic elements which are Noble Metals as a family; and constitute the metals of silver, gold, and platinum as the representative membership. Noble metals do not deteriorate the superconductive properties of high transition temperature materials; are durable; and are excellent conductors of electrical current. Within the membership of this family, silver is most preferred due to its minimal costs and lower softening temperature in comparison to gold or platinum.

The Noble metals are employed within the present methodology in minutely subdivided or fragmented form. The precise type and nature of the fragments are immaterial and thus include flakes, chips, pellets, particles, powders, or any other minute subdivision of these metals. It is highly desirable, but optional with the user, that all the fragments be relatively uniform or consistent in size, shape, or configuration. It is also most desirable that the fragments be in the range from about 1–50 microns in dimension, with the 20 micron size being preferred. Such small sizes of Noble metal fragments will provide a powder, a dust, or a particulate flaked mass which is easily handled and employed; and may be layered, spread, and deposited as a coating on the external surface of a superconductive material with relative ease and with little or no equipment as such.

It will be noted and appreciated that each member of the Noble metal family individually has a characteristic and unique softening-point temperature as well as a melting-point temperature. It is essential to recognize the difference in properties and characteristics of each Noble metal when warmed to its softening-point temperature in comparison to its attributes when heated to its individual melting-point temperature. When a Noble metal is warmed to its softening-point temperature, the individual fragments of metal become pliable, malleable, mobile, and miscible. There is no liquification as such, however, at the softening-point temperature.

Moreover, Noble metal fragments warmed to their softening-point temperatures may be employed in a unique phenomenon and process known as "sintering-"—which, by definition, allows the individual metal fragments to coalesce into a single mass without actually liquefying the metal. Conversely, heating the Noble metal to its individual melting point temperature causes an outright liquification of the metal and a major change of physical properties into a free flowing liquid. It will be noted and appreciated that a Noble metal heated to its melting point temperature (or greater temperature) loses the capability of being sintered as such; and that there is no correspondence between the characteristics and attributes of liquefied Noble metals in comparison to Noble metals which have been warmed only to its softening-point temperature and thus may be sintered to achieve one or more results or consequences. It is conventionally well recognized and demonstrated that Noble metals which have been melted or liquefied do not provide properties, characteristics, or capabilities similar to Noble metals which have been merely softened and sintered. A representative listing of the softening-point temperature and the melting point temperature for each Noble metal is provided by Table 2 below.

TABLE 2

| Nobel Metal | Preferred Softening-Point Temperature | Melting Point Temperature |
|---|---|---|
| Silver | 820° C. | 960° C. |
| Gold | 840° C. | 1,062° C. |
| Platinum | 1,500° C. | 1,755° C. |

III. Characteristics of the Resulting Improved Superconductor

The results and consequences of performing the present methodology is the generation and production of enhanced superconductors with markedly increased critical current density carrying loads often up to 48% over the untreated material; and enhanced superconductors with a reduced deterioration of critical current load capacity in the presence of or upon application of a magnetic field. The resulting enhanced HTSC product is also protected substantially from environmental degradation; is mechanically improved and strengthened; and allows for rapid and less cumbersome modes of attaching electrical contacts.

IV. Preferred Protocol and Procedural Steps

The preferred protocol and procedure employs finely divided silver fragments as the preferred Noble metal and utilizes a high transition temperature superconductive material as the workpiece upon which the processing is performed. The preferred manipulative steps are as follows.

Step 1: Clean the external surface of the superconductive or other starting material if it has not been freshly manufactured. This cleaning may be performed by rubbing fine (#16) Emery paper against the external surface of the workpiece material to remove a very thin layer of matter from the external surface and to create a freshly exposed chosen area service. For subsequent coating with the fragmented silver.

Step 2: Wearing a plastic or rubber glove (or by utilizing any other suitable article), apply a coating of silver fragments to the chosen area on the external surface of the workpiece material. The coating of silver fragments, preferably silver flakes sized from 10 to 20 microns, are desirably uniformly deposited over the entire chosen area. The fragment covered external surface of the workpiece material will then appear very light gray in color as a consequence of being coated with these silver fragments.

Step 3: Using localized heat and preferably an indirect heat source (such as from an oven with a constant temperature or a laser or any other radiation source), start to warm the silver coating on the external surface of the workpiece material. The heating temperature should be carefully adjusted and controlled such that the temperature of the underlying workpiece material does not approach 800° to 900° C. (depending on the material) and that the external coating of silver fragments becomes heated only to the softening-point temperature (preferably about 810°-850° C. in most instances) of the silver. Should another Noble metal other than silver be employed in fragmented form as the external coating, the temperature should also be carefully controlled to avoid decomposing the superconductive material; and to reach only the softening-point temperature and avoid the melting point temperature for that Noble metal.

Step 4: Keep the heat of the oven (or other heat source) indirectly on the silver coating at the correct temperature, preferably at 810° C. for about 20 minutes duration. The softening silver fragments of this external coating will begin to migrate and move along and superficially cover the external surface of the superconductive material; and only slightly penetrate the thickness and substance of the superconductive or workpiece material in a very limited degree. Note, however, that softened silver fragments will occupy and internally fill the void spaces existing between the grains of the workpiece material at the external surface-that is, the softened silver fragments will tangibly sink between and become superficially embedded within the grains of the HTSC material itself forming the exterior surface as a consequence of being softened. If one takes the heating source away from the external surface of the chosen area of the workpiece material, one can see that the softened silver fragments in the coating have covered and co-mingled with the external surface; and that the color of the external surface has changed from black to dark gray due to the presence of the silver fragments which are now covering and superficially embedded between the surface grains of the workpiece.

The heating temperature is preferably controlled and for silver is maintained between 810° and 870° C., but can be raised to 900° C. if needed. One should take care never meaningfully to approach, much less exceed, the melting point temperature (960° C.) of silver. The danger in overheating and exceeding the desired temperature range is that as the temperature approaches 960° C., the silver fragments of the external coating will quickly melt and form a metallic liquid silver droplet. Once molten silver is formed at or above 960° C., the molten silver cannot migrate, properly cover, or become superficially embedded between the grains of the workpiece material due to its liquefied state and its larger liquid volume. Thus, all safeguards and controls as are possible should be taken and maintained such that the heating temperature for the silver fragments of the coating never approach, much less exceed, the 960° C. temperature. There is also a danger of melting the previously annealed high $T_c$ superconductor which may destroy its superconducting properties.

Step 5: If a deeper diffusion and multiple covering and penetration of silver (or other Noble metal) into the thickness and substance of the superconductive or other workpiece material is desired or required by the user, steps 2, 3, and 4 may be repeated in sequence for an additional one or more cycles. This increased diffusion of Noble metal fragments into the midst of the workpiece material is completely optional. Nevertheless, under some use circumstances envisioned, it may be highly desirable to repeat the cycle of applying the Noble metal as a superficial coating and heating the Noble metal fragments to their softening-point temperature at least once more-because the critical current density for that material will become further enhanced and additionally increased by the presence of additional and greater quantities of silver covering and superficially embedded within the grains of the superconductor. In each instance of individual cyclic repetition, however, it should be noted that the heating temperature should not approach or exceed the melting point temperature value of the Noble metal in order to permit the softened metal to migrate, cover, and become embedded within the grains of the workpiece HTSC material.

V. Optional Formation of An External Contact for Electrical Juncture.

The procedure disclosed below is an auxiliary processing technique and optional complement to the practice and performance of the present invention; and presumes and relies upon the existence and actual completion of the methodology for markedly increasing the critical current density loading capacity as previously disclosed herein. This auxiliary and entirely optional technique of forming an electrically conductive external contact of reduced electrical resistance is the subject matter of copending U.S. patent application Ser. No. 902,224 filed Jun. 19, 1992 and entitled "Method For Making An Electrically Conductive Contact For Joining High $T_c$ Superconductors"; and is expressly incorporated by reference herein. A summary of the manipulations is provided below.

Optional Step 6: An external coating of fragmented silver (or other Noble metal) is applied to a chosen area or zone on the external surface of the workpiece material following the manipulations described within steps 1–5 above. It is desirable that this final coating of silver fragments be substantially greater in quantity and thus provide a thicker continuous coating of silver over the previously heated chosen area-in order that a uniform externalized contact be formed.

Optional Step 7: This additional coating of silver fragments is heated to at least the softening-point tempera lucre for the Noble; metal fragments; but this warming will not approach or exceed the melting point temperature of 960° C. This additional coating of silver fragments will be carefully sintered on the external surface thereby coalescing the individual fragments into a single unified mass under the influence of heat, without ever actually liquefying the metal fragments themselves. By controlling the heating source such that the softening heat is directed mainly at the final external coating for only a few seconds without allowing the temperature of the silver previously covering and superficially embedded within the superconductor to rise in similar or identical degree, the softened fragments comprising the additional silver layer will self-adhere and become attached to the external surface of the superconductive or workpiece material and thereby form a metalized pad as a discrete layer on the exterior of the workpiece material. It is essential and critical, therefore, to carefully control the warming temperature; and to take adequate measures to ensure and control the amount of heat applied to this additional coating of silver fragments such that it does not approach or exceed the 960° C. value.

The consequence of warming this additional coating is the formation of a discrete, solid, metallic silver layer on the external surface of the superconductive material. This silver layer and pad lies joined to and is in electrical communication with the silver fragments already covering the superconductor workpiece material. However, by forming a unified and discrete silver layer and pad on the external surface, this additional coating forms a discrete electrical contact, electrical connection and junction surface which adheres to the external surface and is in electrical communication with such silver as is covering or lies embedded within the substance of the superconductor itself.

Optional Step 8: The unified mass or layer of silver is allowed to cool and form a solid, electrically conductive contact on the surface of the superconductive or workpiece material. Once solidified, the external conductive contact may be employed to advantage to join other superconductors, semiconductors, or normal conductors to the superconductive material using this discrete conductive contact as both the point of physical and electrical union.

Optional Step 9: To restore the superconducting properties of the workpiece material (which may have been instituted before but were lost due to heating), the workpiece material with the resulting conductive contact on its external surface is annealed using conventionally known procedures. The preferred annealing process places the material in molecular oxygen at 500° C. for 6 to 48 hours, followed by slow cooling in the presence of flowing molecular oxygen until room temperature (20° C.) is achieved. During the annealing process, the high $T_c$ superconductor regains its characteristic superconductive properties.

VI. Experiments and Empirical Data Illustrating the Increased Critical Current Density The above described protocol and preferred procedure was employed using 20 micron flaked fragments of silver as the coating in combination with BSCCO ceramic superconducting material (comprised of bismuth, strontium, calcium, and copper oxides). The goal is to build electrical power leads to conduct current between 80–70K and 4.5K. For this purpose, high critical currants and low thermal conductivity are important. In application, the HTSC material is in the form of long rods of either rectangular or circular cross section. These rods are reinforced—for mechanical stability and provided with low electrical resistance contacts which on one end connect to copper leads and on the other to conventional low temperature superconducting leads such as copper-clad niobium titanium.

Methods and Materials

A long rectangular rod of BSCCO ceramic material, characterized as 95% 2223 phase, of 8.0 cm length and 0.3 cm×0.3 cm cross section, is cut into two halves. Thus the two rods are identical except for the treatment of one of the rods as described below. The surfaces of each BSCCO rod are; rubbed with very fine (#16 grade) sand paper to produce an uncontaminated surface. Then only one of the rods is covered with a thin coat of silver.

The silver coating procedure is as follows. One rubs the four surfaces of the rectangular rod with silver flake powder. The particle size of the silver flake is 20 microns. Rubbing a very fine and thin layer of silver coats the external surface of the BSCCO rod so that it looks shiny. The flaked coating layer is about 20 microns thick.

One then applies contact pads for current and voltage leads to both rods in order to subsequently measure their critical currents by means of the conventional four point method. Several methods are conventionally used for this purpose [Ekin et al., *Appl. Phys. Lett.* 52:331 (1988); Ekin et al., *Appl. Phys. Lett.* 52:1819 (1988); Suzuki et al., *Appl. Phys. Lett.* 54:666 (1989); Jin et al., *Appl. Phys. Lett.* 54:2605 (1989); Katz et al., *J. Appl. Phys.* 65:1972 (1989)]. These are pressed indium contacts; ultrasonically soldered bonds; end silver paste—which is then baked in and soldered; sputtered contacts metal sprayed contacts; or silver vapor deposited contacts. In practical application, the contact resistance should be minimal to avoid heating of the sample and consequently quenching. Contacts on the BSCCO rod samples are made by the silver diffusion method in which silver flakes are rubbed at four points on the surface of the rod. To form silver pads, the rods were heat treated, and two more layers of silver were added, followed by a heat treatment each time to ensure bonding between the HTSC and silver. After several layers have been built up, a thickness of silver exists as a point of contact to which solder can be easily applied.

In order to ensure bonding between the HTSC rod material and the silver coating as well as the electrical contact pads., the following heat treatment is applied. Each the two rods are inserted into an oven at 810° C. for 10 minutes in air. Then they are cooled down to room temperature at a rate of 5° C./min. In this procedure, for a rod which is coated over its surface with silver fragments, the silver coating diffuses between the HTSC grains; and the four silver pads are left externally because they are thicker. On the other hand, the uncoated rod will only have the four silver pads. The area of each contact pad on any rod was approximately 0.3×cm 0.3 cm 0.3 cm. To make the contact between metallic conducting wires and the pads on the High $T_c$ material, Supersolder [U.S. Pat. No. 4,996,142], a low temperature soldering alloy, is used. This alloy has a contact resistance which is lower by a factor of three than that of conventional solder contacts between HTSC deposited silver and copper.

Results

The critical current of both the silver-surface coated and the uncoated BSCCO rods are individually measured by means of the conventional four probe technique at 77K. The results are shown in FIG. 1. The critical current of sample rod #1 without silver coating as seen, is 20 A—yielding a critical current density of 250 N cm$^2$. The value of the critical current of sample rod #2—the silver-coated rod, is about 30 A, current density of 370 A/cm$^2$. Thus the silver coating has resulted in an increase in $J_c$ of 48%.

Figure 2:
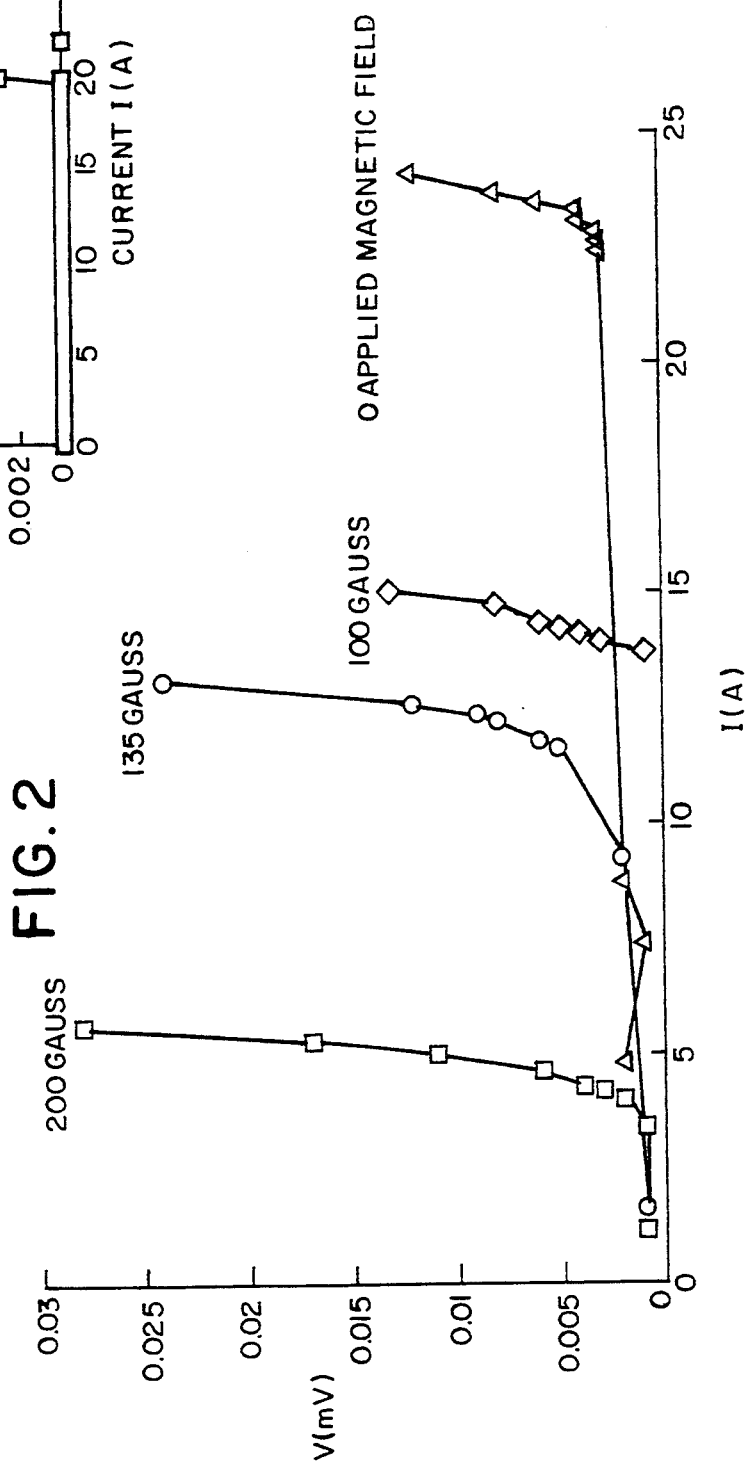
FIG. 2 is a graph illustrating the current voltage characteristics of a silver coated BSCCO rod in the presence of various magnetic fields.

FIG. 2 shows the voltage-current characteristics of the silver coated rod in various magnetic fields, which are applied normal to the rod. Each trace shown in the figure shows the behavior of the voltage along the rod as the current through the rod is increased from zero amperes to values of several amperes. The trace labeled "O Applied Magnetic Field" illustrates the transition of the rod from a superconducting state to the normal state as the current in the rod is increased. This transition is indicated by the appearance of a sizable and increasing voltage in the characteristic. The value of the critical current for this zero field case can be read from the figure and is seen to be about 23 amperes. The values of the critical currents for each of the additional traces can also be determined, in like fashion, from the figure and, by inspection, it is seen that the critical current of the rod decreases as the applied magnetic field is increased.

Several attempts have also been made to increase the critical current density of the HTSC material by mixing different materials with the HTSC powder, e.g.—mixing of the two phases of BSCCO, 2212 and 2223 using the technique of Guo et al. [*Physica* C200:147 (1992)]; or by the addition of silver powder to the BSCCO powder before sintering. These methods have had both desirable and undesirable effects on the critical current and its behavior in a magnetic field.

Figure 3:
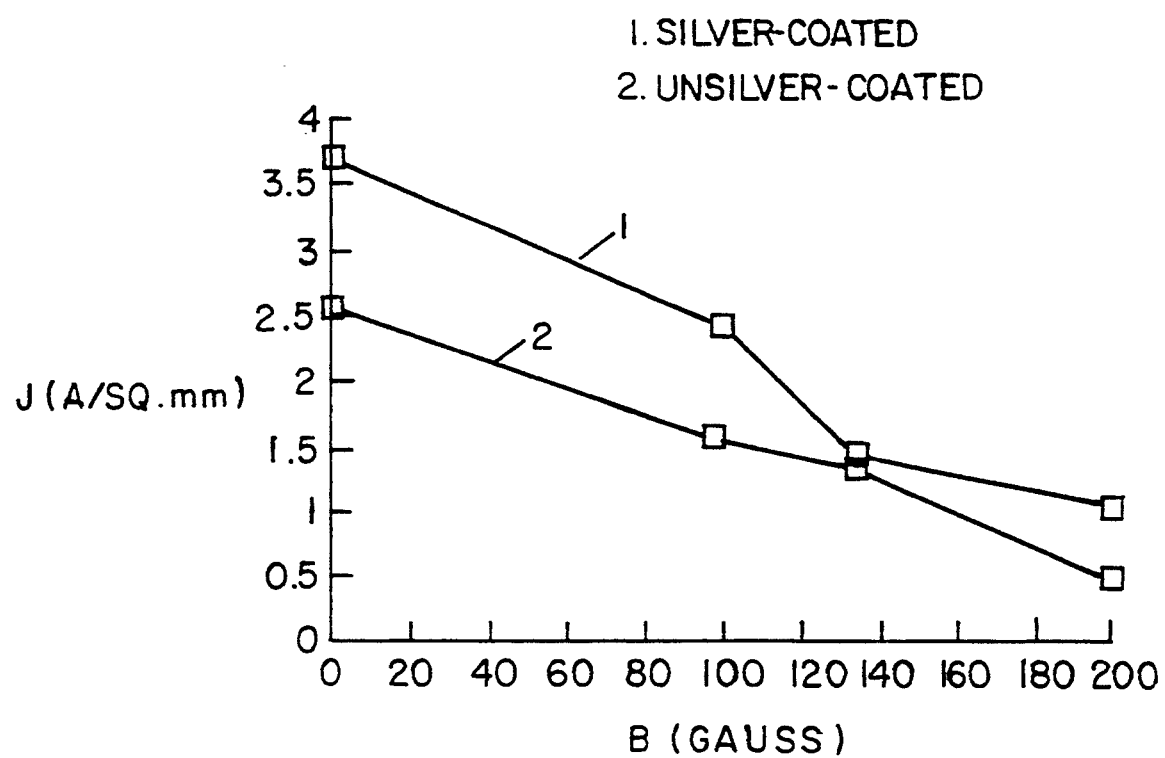
FIG. 3 is a graph illustrating the critical current density as a function of magnetic field strength for silver coated and uncoated IBSCCO rectangular rods.

As is shown by the data of FIG. 3, the critical current characteristics of an HTSC material can be significantly improved by the application of a thin surface layer of silver which does not significantly add to the thermal conductivity of the rod (but varying with the thickness of the rod). Moreover, the ease; of application makes it an excellent candidate for future applications. In addition., the above results suggest that even in granular HTSC material, the bulk of the current is carried near the surface. This is seen by the following. It is apparent that the current application methodology does not result in the diffusion of the silver to any macroscopic distance beyond the surface of the rod. It is further apparent that this silver layer will effect the behavior of the bulk superconductor most strongly in the region of the superconductor where it is applied, i.e.—on its surface. These two facts together with the significant increase in the current carrying capacity indicate that application of the silver layer is enhancing the major current carrying channel in the bulk superconductor which must therefore be present at the surface of the rod.

Conclusions

These empirical data and results thus demonstrate and support the following:

(a) The present methodology increases the critical current by 48% in comparison to the untreated HTSC material; and (b) The present methodology increases the critical current significantly in the presence of a magnetic field over that found as the original value.

The present invention is not to be limited in scope nor restricted in form except by the claims appended hereto.

What we claim is:

1. A method for increasing the critical current density carried by a high transition temperature superconductive material, said method comprising the steps of:

providing an elongated article of high transition temperature superconductive material;

providing a noble metal in fragmented form, said noble metal being selected from the group consisting of silver, gold and platinum;

applying said noble metal fragments as at least one superficial coating over the external surface of said elongated article of high transition temperature superconductive material;

heating said superficial coating of noble metal fragments upon said external surface of said elongated article of high transition temperature superconductive material to a temperature greater than the softening-point temperature and less than the melting-point temperature of said noble metal such that said heated noble metal fragments of said superficial coating soften, migrate over and superficially cover said external surface of said elongated article and become only superficially embedded within said high transition temperature superconductive material; and allowing said heated noble metal superficial covering on said external surface of said elongated article of high transition temperature superconductive material to cool and solidify.

2. The method of recited in claim 1 wherein a plurality of noble metal fragment coatings are superficially applied and heated on said external surface of said elongated article of high transition temperature superconductive material.

* * * * *